(12) United States Patent
Furukawa et al.

(10) Patent No.: US 7,233,063 B2
(45) Date of Patent: Jun. 19, 2007

(54) BORDERLESS CONTACT STRUCTURES

(75) Inventors: Toshiharu Furukawa, Essex Junction, VT (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/375,624

(22) Filed: Mar. 14, 2006

(65) Prior Publication Data

US 2006/0157743 A1   Jul. 20, 2006

Related U.S. Application Data

(62) Division of application No. 10/710,675, filed on Jul. 28, 2004, now Pat. No. 7,074,666.

(51) Int. Cl.
 *H01L 23/48* (2006.01)
(52) U.S. Cl. .................. 257/690; 257/774; 257/249; 257/365; 257/401
(58) Field of Classification Search ................ 257/213, 257/288, 774, 690, 249, 401, 365
 See application file for complete search history.

(56) References Cited

U.S. PATENT DOCUMENTS

| | | | |
|---|---|---|---|
| 5,621,232 A | * | 4/1997 | Ohno .................. 257/288 |
| 6,066,534 A | | 5/2000 | Son |
| 6,153,510 A | | 11/2000 | Ishibashi |
| 6,207,514 B1 | | 3/2001 | Furukawa et al. |
| 6,261,924 B1 | | 7/2001 | Mandelman et al. |
| 6,333,220 B1 | | 12/2001 | Mandelman et al. |
| 6,335,279 B2 | | 1/2002 | Jung et al. |
| 6,403,423 B1 | | 6/2002 | Weybright et al. |
| 6,512,299 B1 | | 1/2003 | Noda |
| 6,531,724 B1 | | 3/2003 | Furukawa et al. |
| 2002/0111025 A1 | | 8/2002 | Weybright et al. |
| 2003/0228752 A1 | | 12/2003 | Strane et al. |

OTHER PUBLICATIONS

IBM Confidential; Self-Aligned Borderless Contacts; Strane, et al.; 4 pages.

* cited by examiner

*Primary Examiner*—Doug Menz
(74) *Attorney, Agent, or Firm*—Schmeiser, Olson & Watts; William D. Sabo

(57) ABSTRACT

A borderless contact structure and method of fabricating the structure, the method including: (a) providing a substrate; (b) forming a polysilicon line on the substrate, the polysilicon line having sidewalls; (c) forming an insulating sidewall layer on the sidewalls of the polysilicon line; (d) removing a portion of the polysilicon line and a corresponding portion of the insulating sidewall layer in a contact region of the polysilicon line; and (e) forming a silicide layer on the sidewall of the polysilicon line in the contact region. Also an SRAM cell using the borderless contact structure and a method of fabricating the SRAM cell.

9 Claims, 11 Drawing Sheets

US 7,233,063 B2

BORDERLESS CONTACT STRUCTURES

This application is a divisional of Ser. No. 10/710,675; filed on Jul. 28, 2004 now U.S. Pat. No. 7,074,666.

FIELD OF THE INVENTION

The present invention relates to the field of semiconductor processing; more specifically, it relates to borderless contacts and methods of fabricating borderless contacts.

BACKGROUND OF THE INVENTION

The need to remain cost and performance competitive in the semiconductor industry has caused continually increasing device density in integrated circuits. Devices in the semiconductor substrate are connected to wiring layers that interconnect these devices into integrated circuits by contacts. The increase in device density makes forming contacts to these devices increasingly difficult. Therefore, there is a need to provide a method of fabricating area efficient contacts to dense device structures.

SUMMARY OF THE INVENTION

A first aspect of the present invention is a method of fabricating a structure, comprising: (a) providing a substrate; (b) forming a polysilicon line on the substrate, the polysilicon line having sidewalls; (c) forming an insulating sidewall layer on the sidewalls of the polysilicon line; (d) removing a portion of the polysilicon line and a corresponding portion of the insulating sidewall layer in a contact region of the polysilicon line; and (e) forming a silicide layer on the sidewall of the polysilicon line in the contact region.

A second aspect of the present invention is a method of fabricating a static random access memory (SRAM) cell; comprising: (a) providing a substrate and forming a dielectric layer on a top surface of the substrate; (b) forming a polysilicon line on a top surface of the dielectric layer; (c) forming an insulating layer on the sidewalls of the first and second gates segments; (d) removing segments of the polysilicon line and corresponding portions of said insulating layer to form a first gate segment common to the first PFET and the first NFET and a second gate segment common to the second PFET and the second NFET, the first and second gate segments having top surfaces, sidewalls and ends; (e) forming source and drains of a first PFET, a second PFET, a first NFET, second NFET, a third NFET and a fourth NFET in the substrate; (f) forming a first silicide layer contacting a first of the ends of the first gate segment and a drain of the second PFET; (g) forming a second silicide region contacting a contact region of at least one the sidewalls of the second gate segment and a drain of the first PFET; (h) forming a third silicide region contacting a contact region of at least one the sidewalls of the first gate segment and a drain of the second NFET; (i) forming a fourth silicide region contacting a first end of the ends of the second gate segment, a drain of the first PFET and a drain of the fourth NFET; and (j) forming a fifth silicide region contacting a second end of the ends of the first gate segment and a drain of the third NFET.

A third aspect of the present invention is a structure, comprising: a polysilicon line on a substrate, the polysilicon line having a sidewall; an insulating sidewall layer on the sidewall of the polysilicon line except in a contact region of the polysilicon line, the contact region extending into the polysilicon line, the polysilicon line in the contact region having a width less than the a width of the polysilicon line in regions of the polysilicon line immediately adjacent to the contact region; and a silicide layer on the sidewall of the polysilicon line in the contact region.

A fourth aspect of the present invention is a static random access memory (SRAM) cell; comprising: a first PFET, a second PFET, a first NFET, a second NFET, a third NFET and a fourth NFET, each PFET and NFET having a source and a drain; a first gate segment common to the first PFET and the first NFET and a second gate segment common to the second PFET and the second NFET, the first and second gate segments having top surfaces, sidewalls and ends; a first silicide layer contacting a first of the ends of the first gate segment and a drain of the second PFET; a second silicide layer contacting a contact region of at least one the sidewalls of the second gate segment and a drain of the first PFET; a third silicide layer contacting a contact region of at least one the sidewalls of the first gate segment and a drain of the second NFET; a fourth silicide layer contacting a first end of the ends of the second gate segment, a drain of the first PFET and a drain of the fourth NFET; and a fifth silicide layer contacting a second end of the ends of the first gate segment and a drain of the third NFET.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The contacts and method of contacting various semiconductor structures will be illustrated using an exemplary six device static random access memory (SRAM) cell. However, the present invention may be applied to many other semiconductor structures and integrated circuits. An SRAM cell using the present invention will be more dense than the same cell not using the present invention.

A bordered contact is defined as a contact that, when properly aligned and when viewed from above, has a closed outline and is contained within the outline of the structure the bordered contact is contacting, i.e. a bordered contact is surrounded on all sides by the outline of the structure being contacted. A first type of borderless contact is defined as a contact that, when properly aligned and when viewed from above, has a closed outline and extends past one or more edges of the outline of structure the contact is contacting. A second type of borderless contact is defined as a contact, when properly aligned and when viewed from above, does not have a closed outline.

Figure 1:
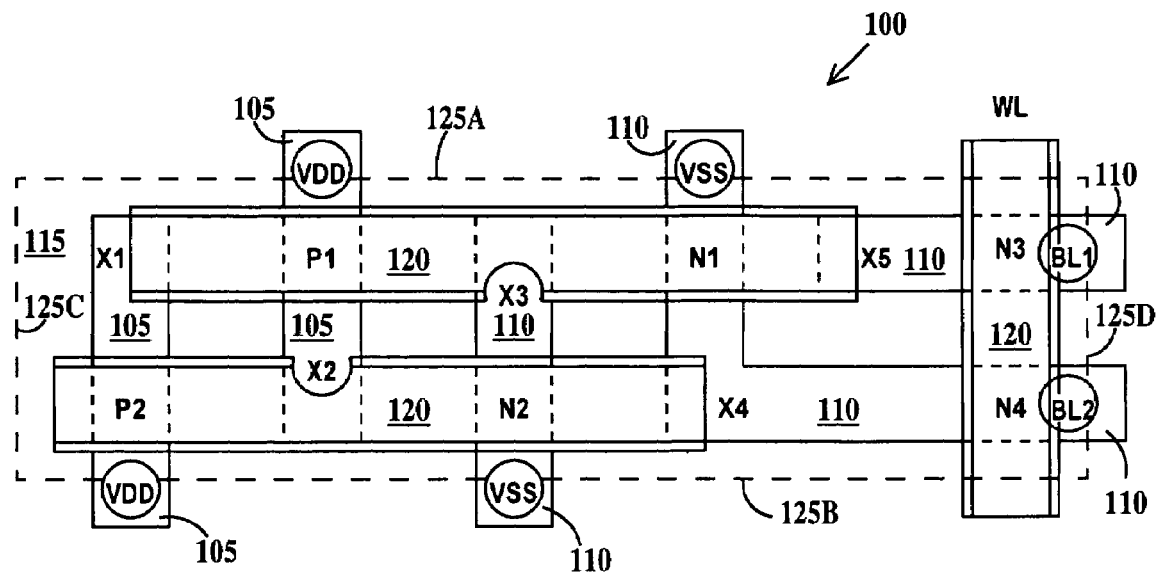
FIG. 1 is a top view of an SRAM cell using borderless contacts according to the present invention.

FIG. 1 is a top view of an SRAM cell 100 using borderless contacts according to the present invention. The first embodiment of the present invention provides for formation of the gates of NFETs and PFETs by direct etch of the gate stack. In FIG. 1, SRAM cell 100 includes P+ source/drains 105 (in N-wells not shown) and N+ source/drains 110 (in P-wells not shown) surrounded by trench isolation (TI) 115. SRAM cell 100 further includes conductive gate segments 120 that serve both as gates for p-channel field effect transistors (PFETs) P1 and P2, as gates for n-channel field effect transistors (NFETs) N1, N2, N3 and N4 and also serve to interconnect PFETs P1 and P2 and NFETs N1, N2, N3 and N4 into an SRAM circuit. Additional interconnections are provided by contacts X1, X2, X3, X4 and X5 which are contacts according to the present invention. Contacts VDD and VSS (in one example VSS is ground) provide power to SRAM cell 100 and contacts BL1 and BL2 are bitline contacts. Wordline contacts are not illustrated in FIG. 1, though the wordline (WL) is indicated.

In FIG. 1, contacts VDD and VSS, are bordered contacts. Contacts BL1 and BL2 are examples of the first type of borderless contacts because they overlap a portion of gate segment 120. Contacts X1, X2, X3, X4 and X5 are examples of the second type of borderless.

SRAM cell 100 may be part of an SRAM array which, in one example, is laid out by mirroring (rotating or reflecting) SRAM cell 100 along the four axes of symmetry 125A, 125B, 125C and 125D, which also define the physical boundary of a single SRAM cell.

Figure 2:
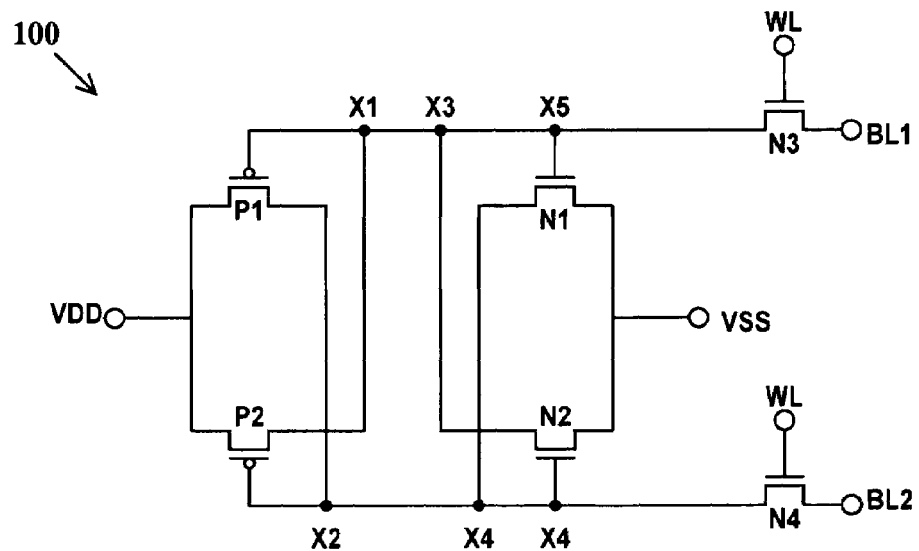
FIG. 2 is a schematic circuit diagram of the SRAM cell of FIG. 1.

FIG. 2 is a schematic circuit diagram of SRAM cell 100 of FIG. 1. In FIG. 2, the sources of PFETs P1 and P2 are connected to VDD. The drain of PFET P1 is connected to the gate of PFET P2, the gate of NFET N2 and the drains of NFET N1 and N4. The drain of PFET P2 is connected to the gate of PFET P1, the gate of NFET N1 and the drains of NFETs N2 and N3. The sources of NFETs N1 and N2 are connected to VSS. The source of NFET N3 is connected to BL1 and the source of NFET N4 is connected to BL2. The gates of NFETs N3 and N4 are connected to WL. It should be noted that contacts X1, X2, X3, X4 and X5 provide the cross-coupling of SRAM cell 100 so a separate interconnect structure is not required. Also, while two contacts X4 are illustrated in FIG. 2, they are physically one and the same contact.

Figure 3A:
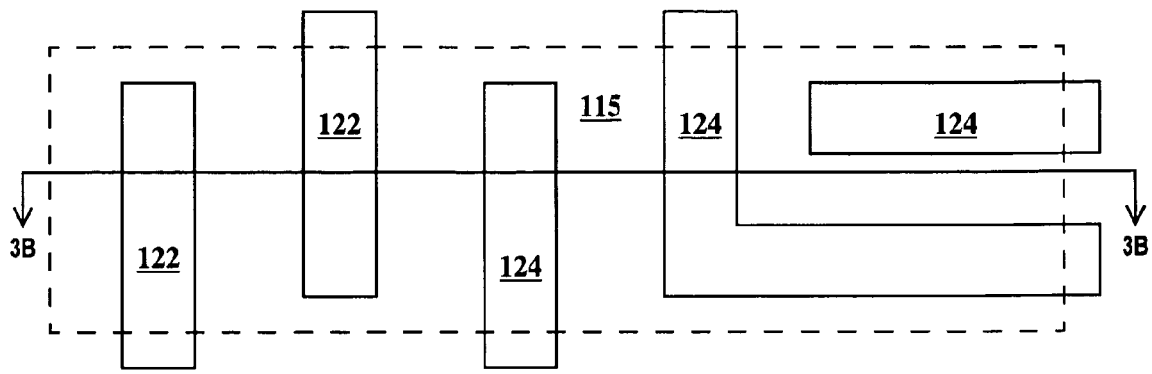
FIG. 3A is a top view of the SRAM cell of FIG. 1
Figure 3B:
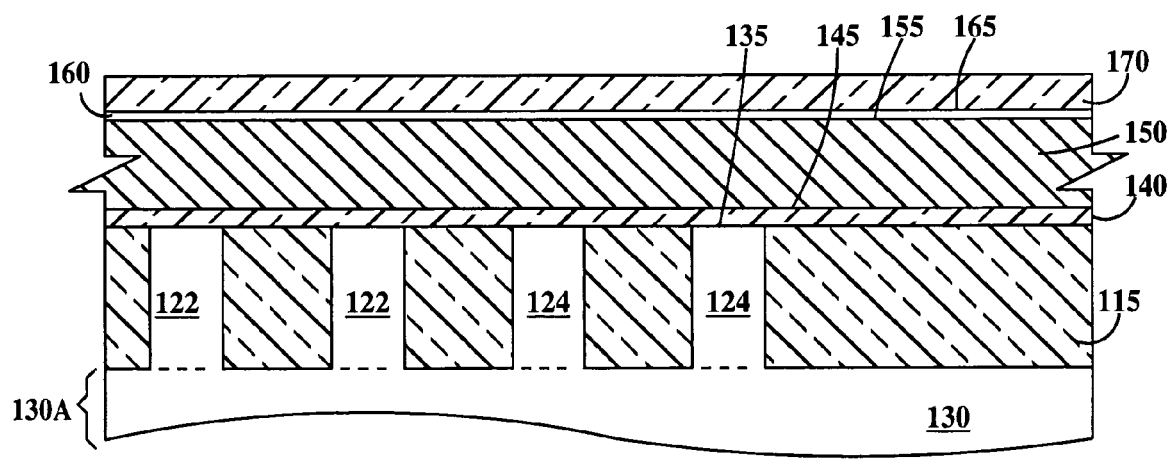
FIG. 3B is a partial cross-sectional view through line 3B—3B of FIG. 3A after a first step of a first embodiment of the present invention.

FIG. 3A is a top view of the SRAM cell of FIG. 1 and FIG. 3B is a partial cross-sectional view through line 3B—3B of FIG. 3A after a first step of a first embodiment of the present invention. In FIG. 3A, N-wells 122 and P-wells 110 are surrounded by trench isolation (TI) 115. Boundary 125 of the of the SRAM cell to be formed is indicated by dashed lines and corresponds to the axes 125A, 125B, 125C and 125D of FIG. 1. In FIG. 3B, it can be seen that N-wells 122, P-wells 124 and T1 115 are formed in a substrate 130. In one example, substrate 130 is a bulk silicon substrate. In another example, substrate 130 is the silicon portion of a silicon-on-insulator (SOI) substrate. In some SOI applications, the only silicon would be N-wells 122 and P-wells 124, the region of substrate 130 indicated by 130A being an insulator such as silicon oxide.

Formed on a top surface 135 of substrate 130 is a gate dielectric layer 140. Formed on a top surface 145 of gate dielectric layer 140 is a gate conductor layer 150. Formed on a top surface 155 of gate conductor layer 150 is an optional metal silicide layer 160. Formed on a top surface 165 of metal silicide layer 160 is a dielectric capping layer 170. Metal silicide layer 160 may be formed by blanket deposition of a metal layer, performing a rapid thermal anneal (RTA) at 350° C. to about 600° C. for about 5 seconds to about 30 seconds to react the metal with top surface 155 of gate conductor 160 (gate conductor is polysilicon in this case) followed by removal of unreacted metal over non-silicon regions. In one example, gate dielectric layer 140 is $SiO_2$ having a thickness of about 0.7 nm to about 3.0 nm. Gate dielectric layer 140 may comprise a high k (high dielectric constant) material, examples of which include $Si_3N_4$, $Al_2O_3$ and $HfO_2$. In one example, gate conductor layer 150 is polysilicon having a thickness of about 70 nm to about 200 nm. If gate conductor layer 150 is polysilicon, it may be intrinsic, doped N-type or doped P-type. In one example, metal silicide layer 160 has a thickness of about 20 nm to about 100 nm. Examples of suitable metal silicides include but is not limited to titanium silicide, cobalt silicide, nickel silicide and platinum silicide. In one example, capping layer 170 is silicon nitride having a thickness of about 25 nm to about 200 nm.

Figure 4A:
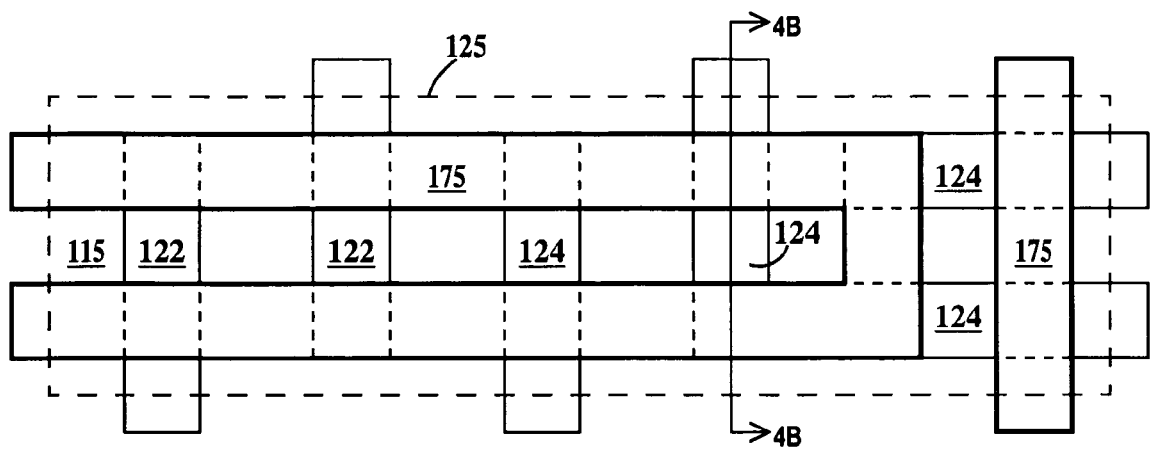
FIG. 4A is a top view of the SRAM cell of FIG. 1
Figure 4B:
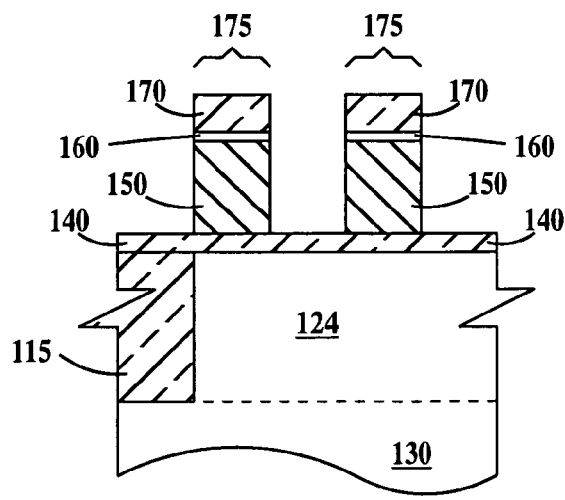
FIG. 4B is a partial cross-sectional view through line 4B—4B of FIG. 4A after a second step of the first embodiment of the present invention.

FIG. 4A is a top view of the SRAM cell of FIG. 1 and FIG. 4B is a partial cross-sectional view through line 4B—4B of FIG. 4A after a second step of the first embodiment of the present invention. In FIGS. 4A and 4B a photoresist layer was formed, a photolithographic imaging step performed, an etch step was performed to remove unwanted gate conductor layer 150, metal silicide layer 160 and dielectric capping layer 170 (in one example a plasma etch process is used) and finally a photoresist removal step was performed to form gate stacks 175.

Figure 5A:
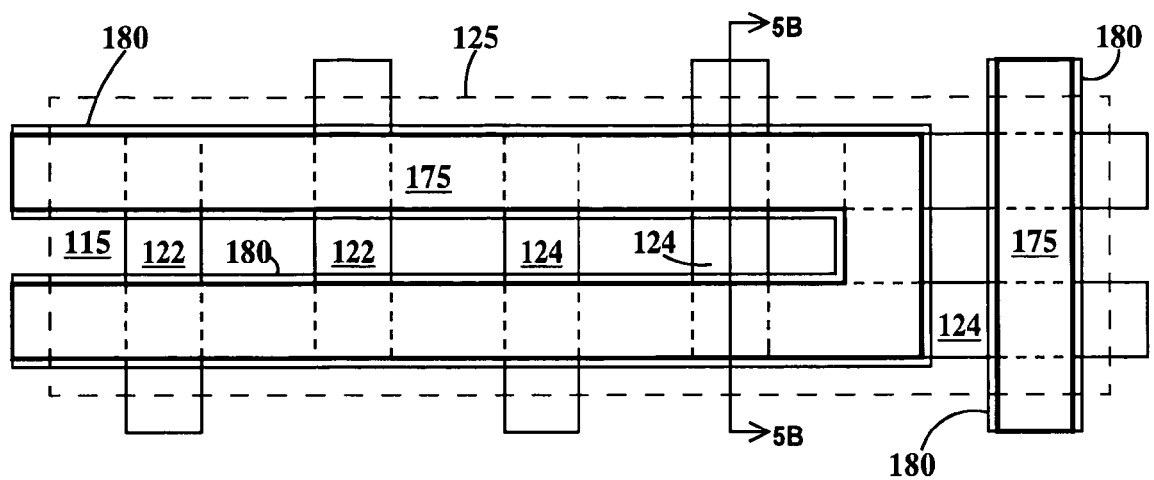
FIG. 5A is a top view of the SRAM cell of FIG. 1
Figure 5B:
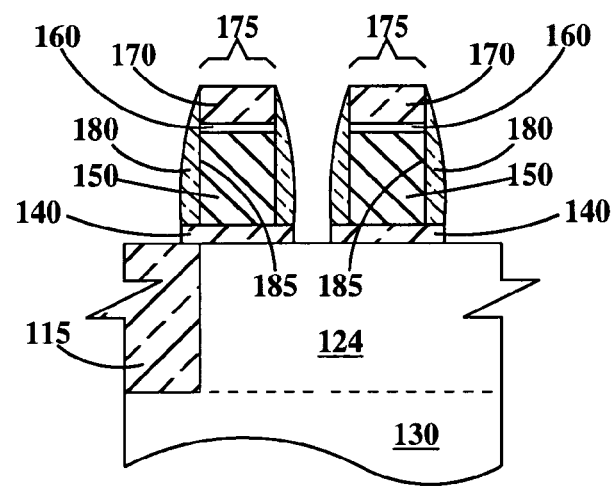
FIG. 5B is a partial cross-sectional view through line 5B—5B of FIG. 5A after a third step of the first embodiment of the present invention.

FIG. 5A is a top view of the SRAM cell of FIG. 1 and FIG. 5B is a partial cross-sectional view through line 5B—5B of FIG. 5A after a third step of the first embodiment of the present invention. In FIGS. 5A and 5B, dielectric spacers 180 are formed on sidewalls 185 of gate stacks 175. and gate dielectric layer 140 removed where not protected by gate stacks 175 and spacers 180. An example of a sidewall spacer process is deposition of a thin layer of conformal insulating material followed by a directional reactive ion etch (RIE) process. This may be repeated several times to build up multiple sidewall spacers over one another. In one example sidewall spacers 180 are silicon nitride having a thickness about 10 nm to about 100 nm.

Figure 6A:
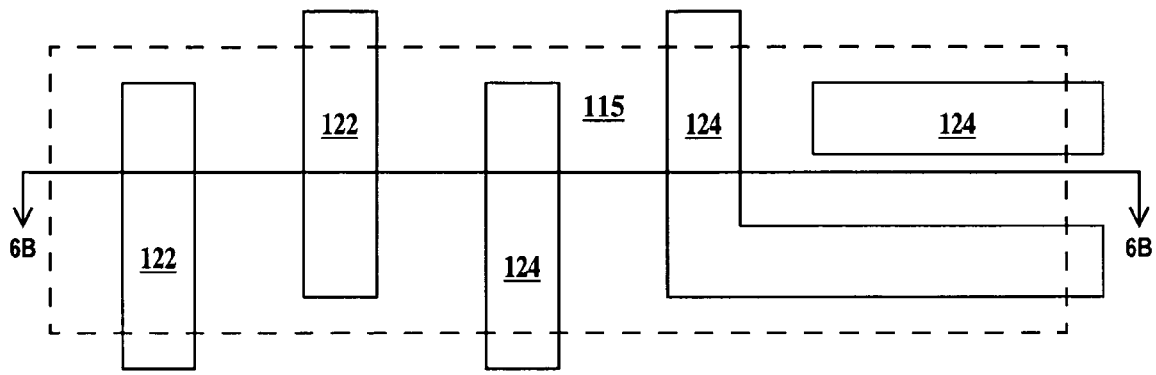
FIG. 6A is a top view of the SRAM cell of FIG. 1
Figure 6B:
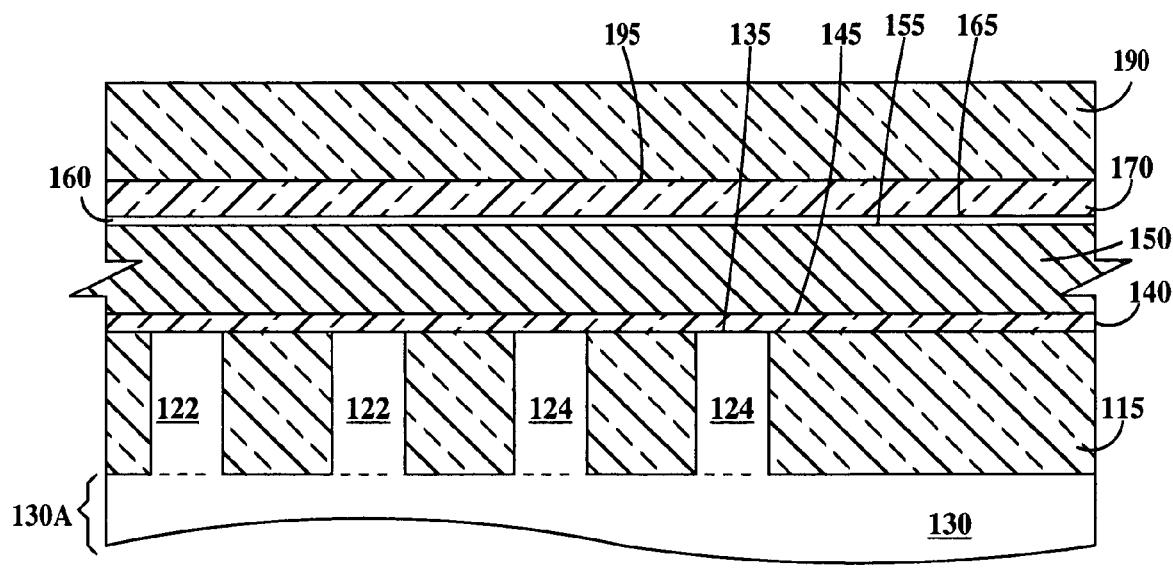
FIG. 6B is a partial cross-sectional view through line 6B—6B of FIG. 6A after a first step of a second embodiment of the present invention.

FIG. 6A is a top view of the SRAM cell of FIG. 1 and FIG. 6B is a partial cross-sectional view through line 6B—6B of FIG. 6A after a first step of a second embodiment of the present invention. The second embodiment of the present invention provides for formation of the gates of NFETs and PFETs by sidewall image transfer processes. FIG. 6B is similar to FIG. 3B except a mandrel layer 190 is formed on top surface 195 of capping layer 170. In one example, mandrel layer 190 is polysilicon having a thickness of about 50 nm to about 200 nm.

Figure 7A:
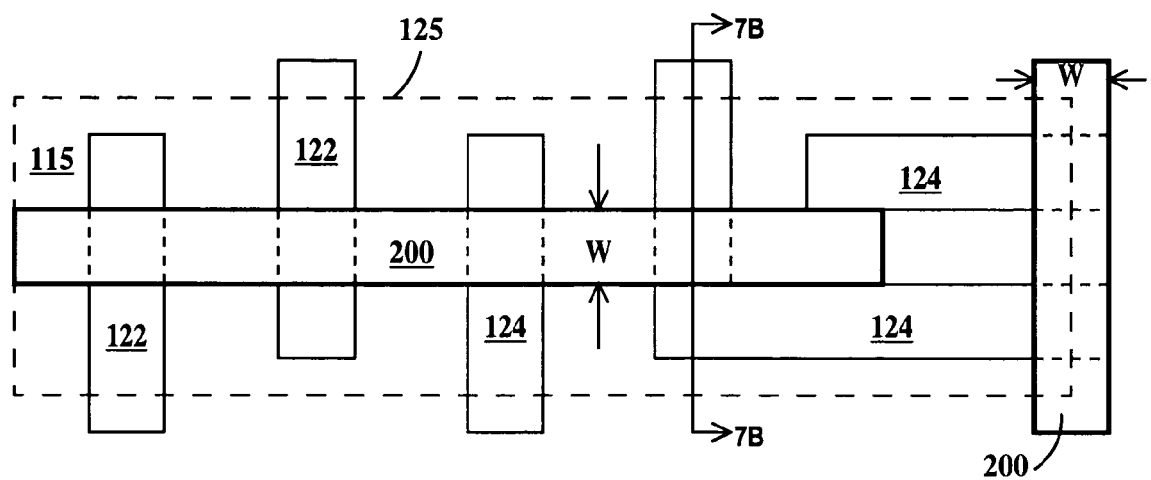
FIG. 7A is a top view of the SRAM cell of FIG. 1
Figure 7B:
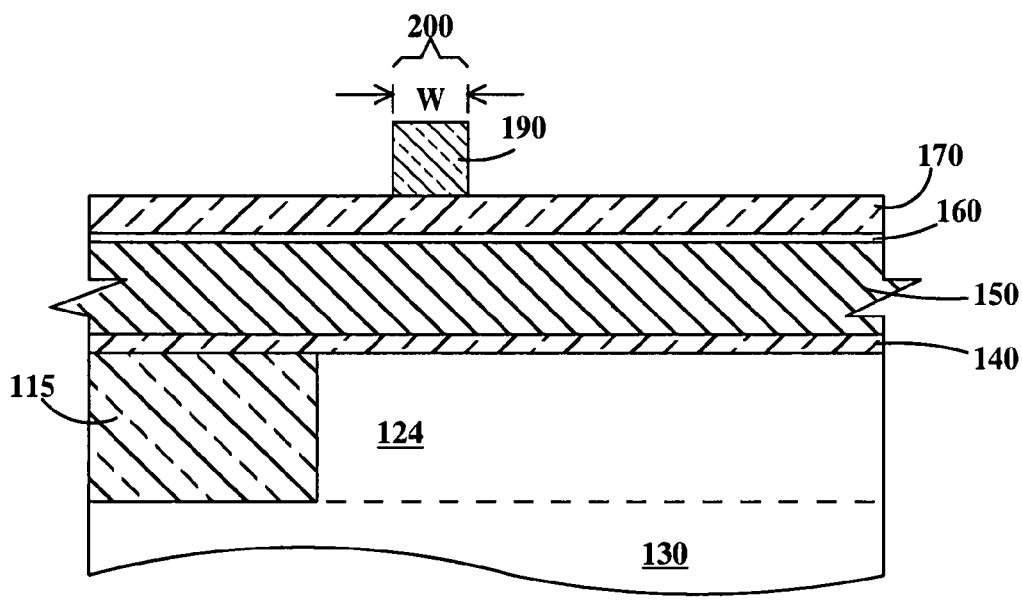
FIG. 7B is a partial cross-sectional view through line 7B—7B of FIG. 7A after a second step of the second embodiment of the present invention.

FIG. 7A is a top view of the SRAM cell of FIG. 1 and FIG. 7B is a partial cross-sectional view through line 7B—7B of FIG. 7A after a second step of the second embodiment of the present invention. In FIGS. 7A and 7B a photoresist layer was formed, a photolithographic imaging step performed, an etch step was performed to remove unwanted mandrel layer 190 and finally a photoresist removal step was performed to form mandrels 200. Mandrels 200 have a width W. In one example, W is about 35 to about 100 nm.

Figure 7C:
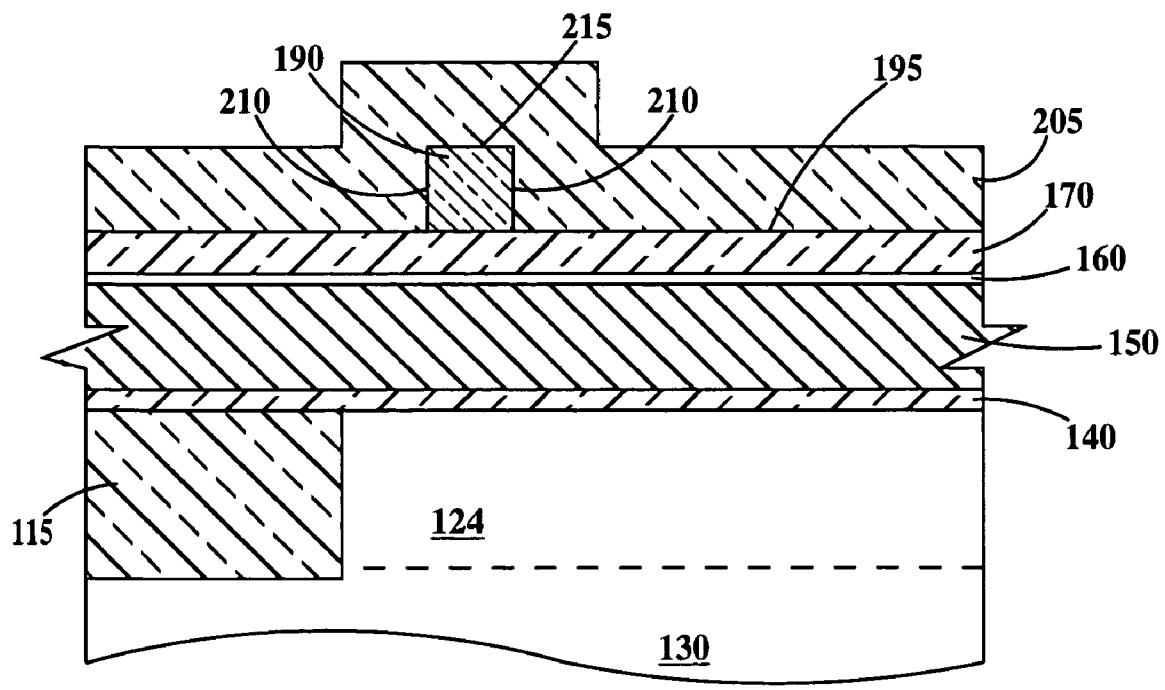
FIGS. 7C through 7F are partial cross-section views through line 7B—7B of FIG. 7A after third through sixth steps of the second embodiment of the present invention.

FIGS. 7C through 7F are partial cross-section views through line 7B—7B of FIG. 7A after third through sixth steps of the second embodiment of the present invention. In FIG. 7C a sidewall transfer layer 205 is formed on top surface 195 of capping layer 170. In one example, sidewall transfer layer 205 is $SiO_2$ having a thickness of about 10 nm to about 50 nm. Sidewall transfer layer 205 covers sidewalls 210 and a top surface 215 of mandrel 200. In one example sidewall transfer layer 205 is plasma enhanced chemical vapor deposition (PECVD) $SiO_2$.

Figure 7D:
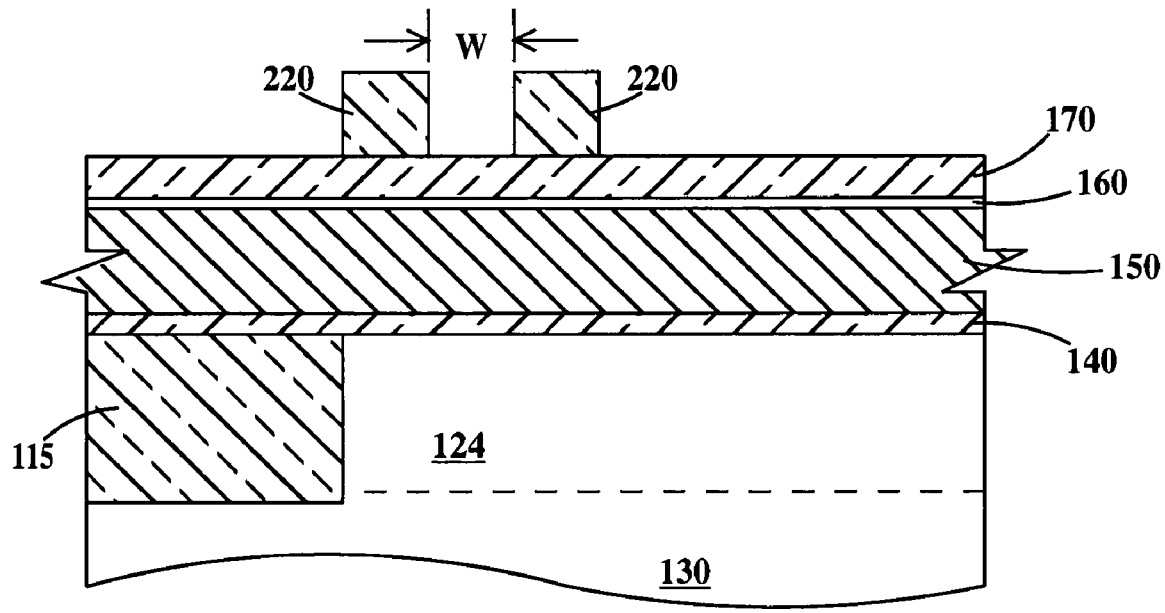

In FIG. 7D, an RIE process is performed to directionally etch sidewall transfer layer 205 and mandrel 200 (see FIG. 7C) is removed. Thus, hard mask images 220 are spaced a distance about equal to W apart. It should be apparent that hard mask images 220 are sidewalls spacers that were formed on sidewalls 210 of mandrel 200 (see FIG. 7C) after the just mentioned RIE process.

Figure 7E:
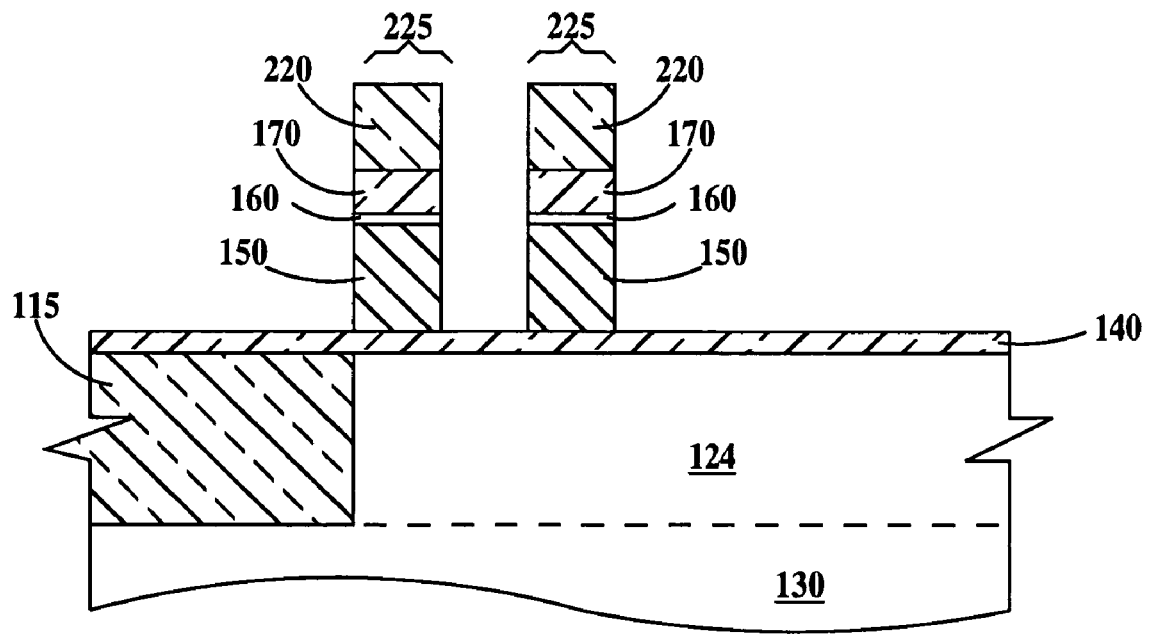

In FIG. 7E an etch step was performed using hard mask images 220 to remove unwanted gate conductor layer 150, metal silicide layer 160 and dielectric capping layer 170 (in one example a plasma etch process is used) to form gate precursor stacks 225.

Figure 7F:
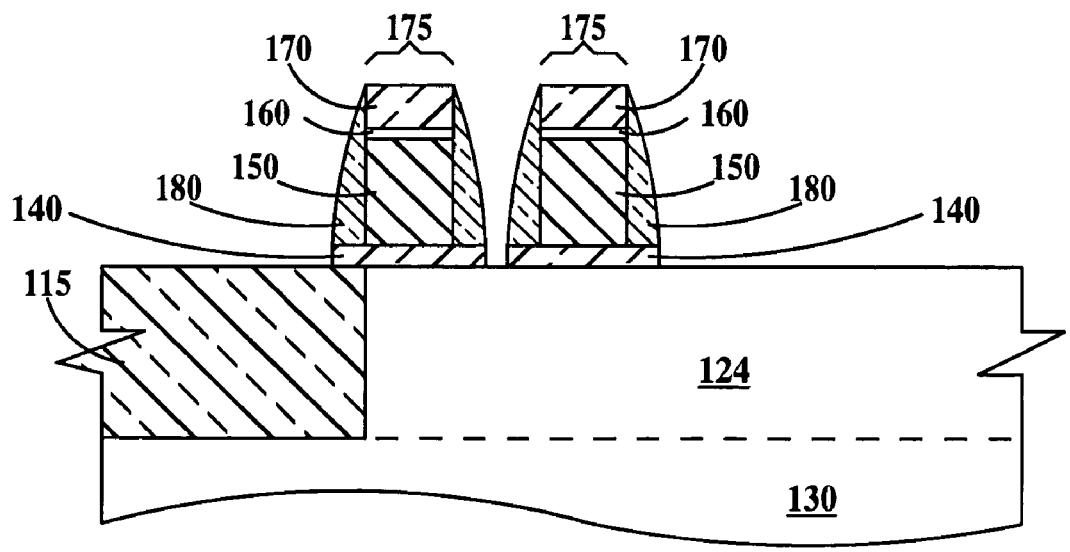

In FIG. 7F, hard mask images 220 (see FIG. 7E) are removed and dielectric spacers 180 are formed on sidewalls 185 of gate stacks 175. Gate dielectric layer 140 is removed where not protected by gate stacks 175 and spacers 180. This may be repeated several times to build up multiple sidewall spacers over one another. The structures of FIG. 7F and of FIG. 5B are essentially the same, so common processing of the first and second embodiments can now proceed.

Figure 8:
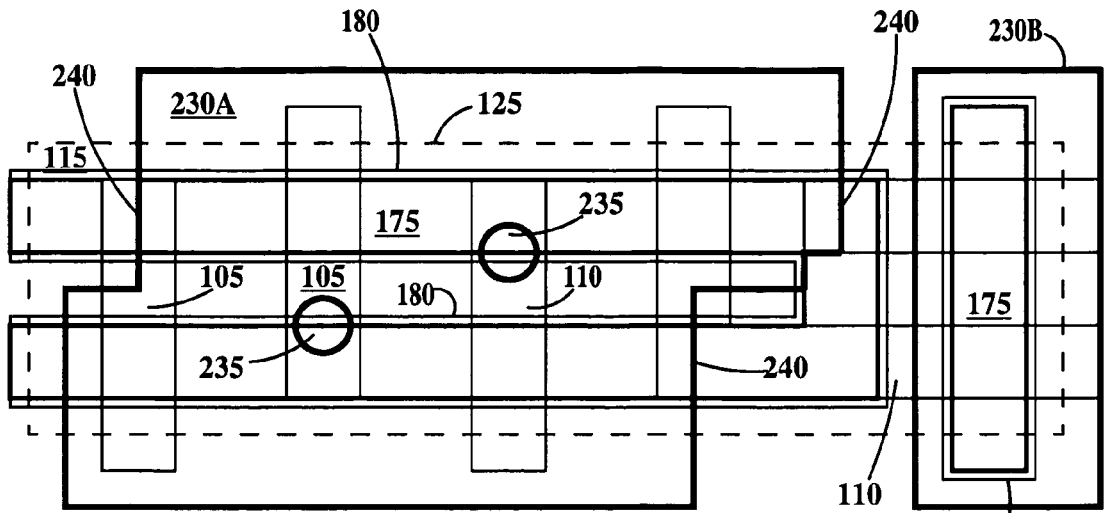
FIG. 8 is a top view of the SRAM cell of FIG. 1 after a first common step after the third step of the first embodiment or after the sixth step of the second embodiment of the present invention.

FIG. 8 is a top view of the SRAM cell of FIG. 1 after a first common step after the third step of the first embodiment or after the sixth step of the second embodiment of the present invention. In FIG. 8, trim mask (also called a loop cutter mask) islands 230A and 230B are formed by application of a photoresist layer followed by a photolithographic process using a single trim mask to form the trim mask islands. Trim mask islands 230A and 230B protect gate conductor layer 150, metal silicide layer 160 and capping layer 170 (see FIGS. 5B and 7F) from removal where gates of PFETS and NFETs and PFET/NFET, PFET/PFET or NFET/NFET interconnections are to be formed. Trim mask island 230A includes opening 235 that will form contacts X2 and X3 of FIG. 9A. Trim mask island 230A also includes edges 240 that will define contacts X1, X4 and X5 of FIG. 9A. In one example, the removal of unwanted gate conductor layer 150, metal silicide layer 160 and capping layer 170 (see FIGS. 5B and 7F) is accomplished by plasma etching. Thus contacts X1, X2, X3, X4 and X5 and gate segments 120 are defined at the same time and by the same single mask (see FIGS. 1 or 9A).

After the trim mask process, $P^+$ source/drain diffusions 105 and $N^+$ source/drain diffusions 110 are formed (see FIG. 9A), for example, by ion implantation processes known in the art.

Figure 9A:
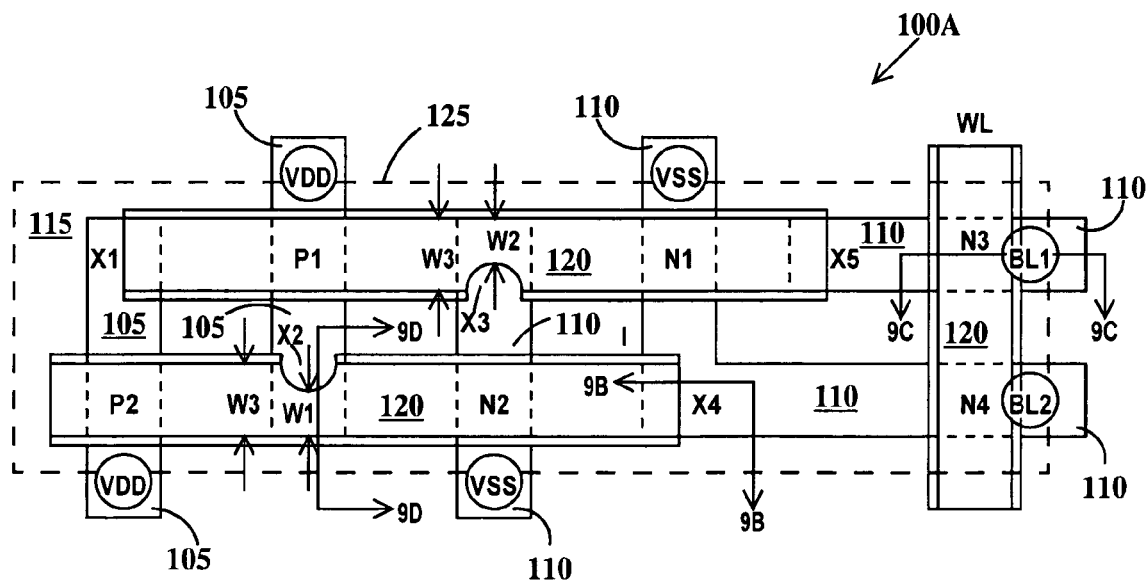
FIG. 9A is a top view of a completed SRAM cell according to the present invention.

FIG. 9A is a top view of completed SRAM cell 100A according to the present invention. SRAM cell 100A is identical to SRAM cell 100 of FIG. 1, 100. It should be noted that gate stack 175 is segmented into two gate segments 120 by trim mask island 235A (see FIG. 8). The gate segment over PFET P1 and NFET N1 is the first gate segment and the gate segment over PFET P2 and NFET N2 is the second gate segment.

Gate segments 120 have a width W1 in the region of contacts X2 and a width W2 in the region of contact X3 and a width W3 in regions of the gate segment immediately adjacent to contact regions X2 and X3. W1 is less than W3 and W2 is less than W3. W1 may or may not be equal to W2. Source drain diffusions have been made in the Pwell and Nwell regions (not shown) where the notches for the X2 and X4 contacts into the gate segments 120 were made.

Figure 9B:
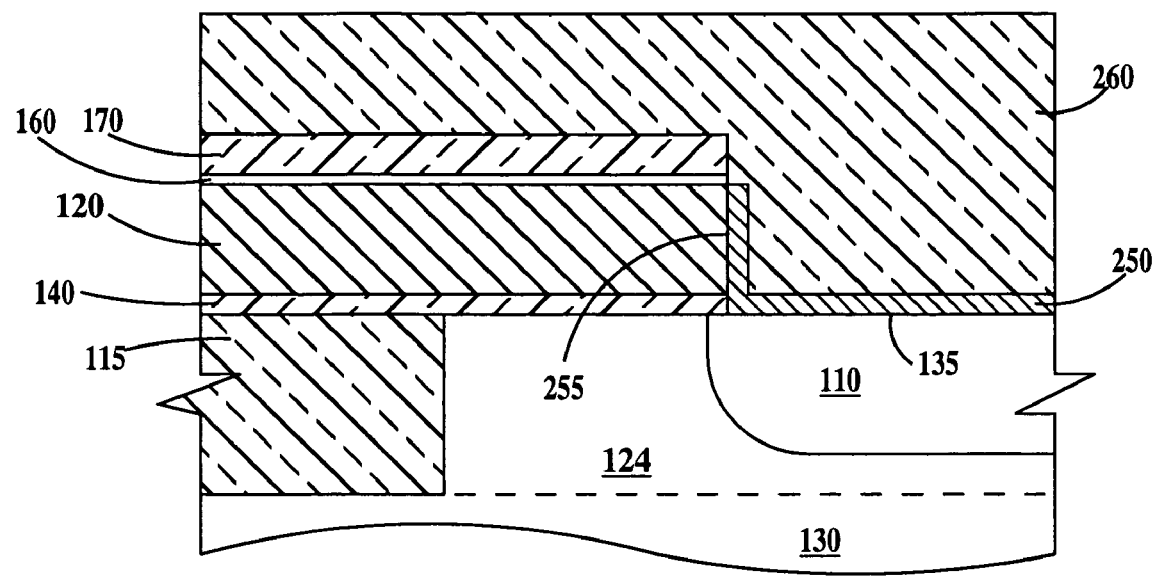
FIG. 9B is a partial cross-sectional view through line 9B—9B of FIG. 9A a first type of borderless contact according to the present invention.

FIG. 9B is a partial cross-sectional view through line 9B—9B of FIG. 9A a first type of borderless contact according to the present invention. FIG. 9B illustrates contacts X4 and X5 of FIG. 9A. Note contact X1 is formed similarly. In FIG. 9B, a metal silicide layer 250 is formed on exposed top surface 135 of N+ source/drain 110 (after gate dielectric layer 140 is removed) and on exposed sidewall 255 of gate segment 120. In FIG. 9B, metal silicide layer 250 acts a an "interconnect" between gate segment 120 and N+ source/drain 110. An interlevel dielectric layer 260 is formed over substrate 130.

Metal silicide layer 250 may be formed by blanket deposition depositing a metal layer on exposed top surface 135 of N+ source/drain 110 and on exposed sidewall 255 of gate segment 120, performing a rapid thermal anneal (RTA) at 350° C. to about 600° C. for about 5 seconds to about 30 seconds causing silicide formation where the metal is in contact with silicon followed by removal of unreacted metal from non-silicon regions. In one example, metal silicide layer 260 has a thickness of about 10 nm to about 100 nm. Examples of suitable metal silicides include but is not limited to titanium silicide, cobalt silicide, nickel silicide and platinum silicide.

Figure 9C:
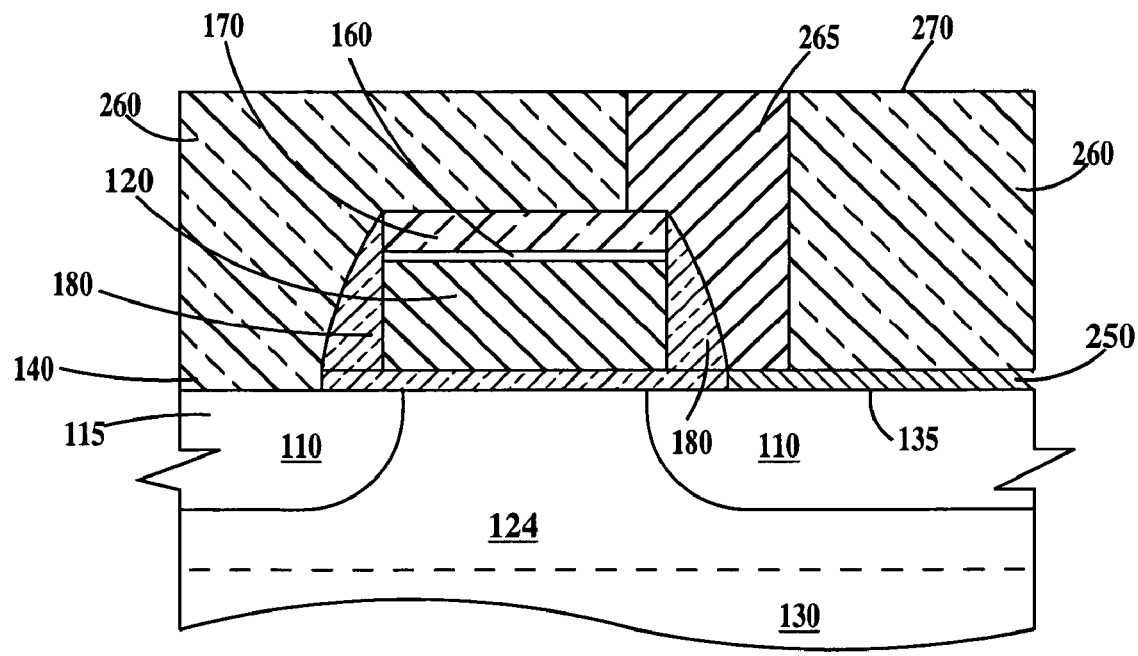
FIG. 9C is a partial cross-sectional view through line 9C—9C of FIG. 9A a second type of borderless contact according to the present invention.

FIG. 9C is a partial cross-sectional view through line 9C—9C of FIG. 9A. FIG. 9C illustrates bitline contacts BL1 and BL2 of FIG. 9A. In FIG. 9C, metal silicide layer 250 is formed on exposed top surface 135 of N+ source/drain 110 (after gate dielectric layer 140 is removed), interlevel dielectric layer 260 is formed over substrate 130 and a conductor filled stud 265 is formed from a top surface 270 of interlevel dielectric layer 260 through the interlevel dielectric layer to contact metal silicide layer 250. It should be noted that stud 265 overlays a portion of gate segment 120 but is prevented from electrically shorting to the gate segment by spacer 180 and capping layer 170. In one example, stud 265 is tungsten.

Again, the region of N+ source/drain 110 contacted by metal silicide layer 250 may be highly doped N-type (such as from a source/drain ion implantation performed after the processes illustrated in FIG. 8 and described supra, but before metal deposition for metal silicide formation) to reduce contact resistance between the metal silicide layer and channel formed in the P-well. Formation of metal silicide layer 250 has been discussed supra.

Figure 9D:
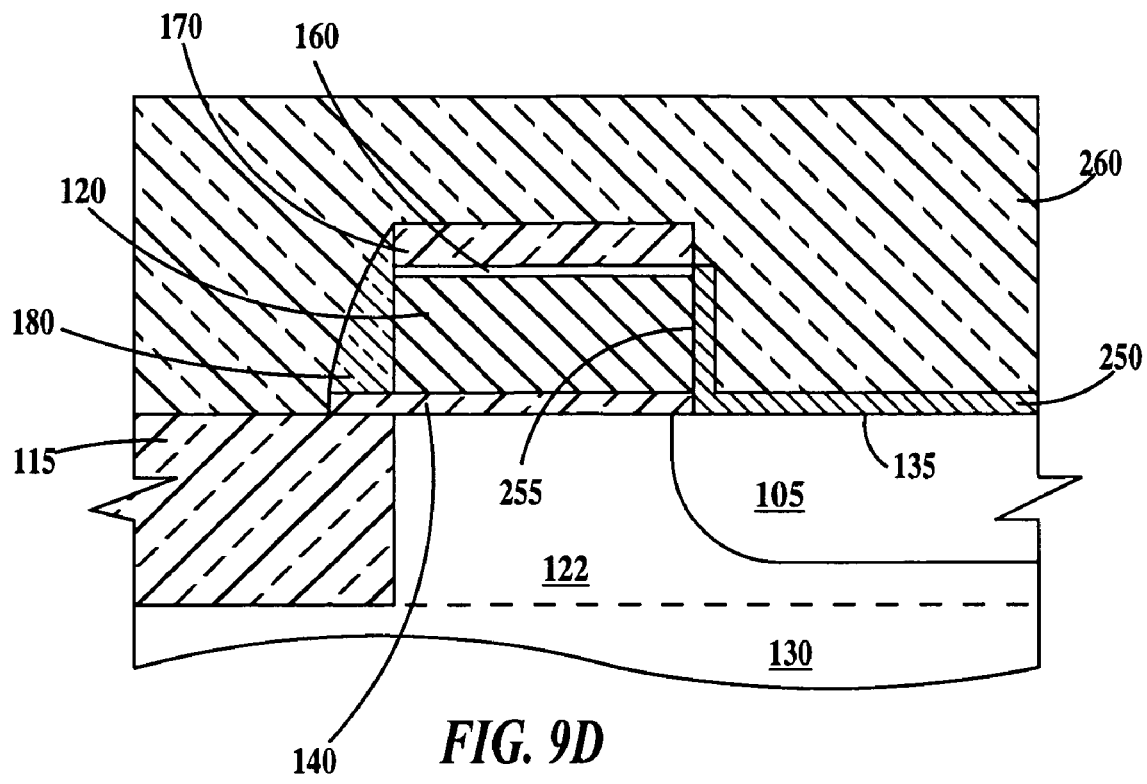
FIG. 9D is a partial cross-sectional view through line 9D—9D of FIG. 9A a third type of borderless contact according to the present invention.

FIG. 9D is a partial cross-sectional view through line 9D—9D of FIG. 9A a third type of borderless contact according to the present invention. FIG. 9D illustrates contacts X2 and X3 of FIG. 9A. Contacts X2 and X3 are similar to contacts X1, X4 and X5 except contacts X1, X4 and X5 were defined by the edges 240 of trim mask island 230A while contacts X2 and X3 were defined by openings 235 in trim mask island 230A (see FIG. 8). Contacts X2 and X3 are "bites" taken out of gate segments 120.

In FIG. 9D, a metal silicide layer 250 is formed on exposed top surface 135 of N+ source/drain 110 (after gate dielectric layer 140 is removed) and on exposed sidewall 255 of gate segment 120. In FIG. 9D, metal silicide layer 250 acts a an "interconnect" between gate segment 120 and P+ source/drain 105. Interlevel dielectric layer 260 is formed over substrate 130. Formation of metal silicide later 250 has been discussed supra.

Figure 9E:
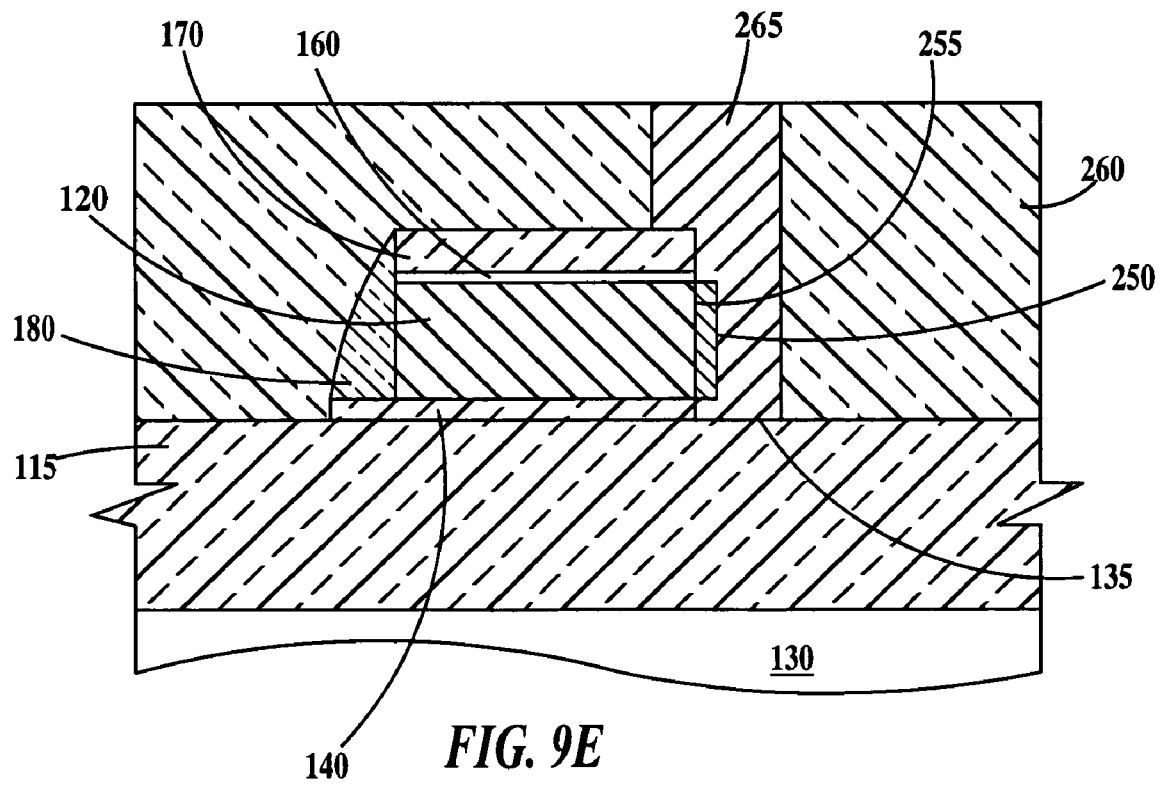
FIG. 9E is a partial cross-sectional view illustrating a fourth borderless contact type according to the present invention.

FIG. 9E is a partial cross-sectional view illustrating a fourth borderless contact type according to the present invention. In FIG. 9E, a contact similar to the bitline contact illustrated in FIG. 9C is formed except, metal silicide layer 250 is only formed on exposed sidewall 255 of gate segment 120 because of TI 115 under laying the contact area rather than silicon. Stud 265 electrically contacts gate segment 120 through silicide layer 250.

Thus, the present invention provide a method of fabricating area efficient contacts to dense device structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    a polysilicon line on a substrate, said polysilicon line having a first sidewall and an opposite second sidewall;
    a first insulating sidewall layer on said first sidewall and a second insulating layer on said second sidewall of said polysilicon line except on a sidewall of a notch in said second sidewall of said polysilicon line, said notch extending into said polysilicon line toward said first sidewall and extending from said top surface of said polysilicon line to a bottom surface of said polysilicon line, a width of said polysilicon line from said top surface to said bottom surface of said polysilicon line between said notch and said first sidewall of said polysilicon line less than a width of said polysilicon line in regions of said polysilicon line immediately adjacent to said notch; and
    a silicide layer on a sidewall of said notch.

2. The structure of claim 1, further including:
    a silicon region in said substrate; and
    said silicide layer extending over and in direct contact with at least a portion of said silicon region.

3. The structure of claim 2, further including:
    a gate dielectric between said polysilicon line and a top surface of said substrate.

4. The structure of claim 1, wherein said suicide layer includes a material selected from the group consisting of titanium suicide, cobalt silicide, nickel silicide and platinum silicide.

5. The structure of claim 1, further including:
    an additional silicide layer on said top surface of said polysilicon line; and
    an insulating layer on a top surface of said additional silicide layer.

6. The structure of claim 5, wherein an additional suicide layer includes a material selected from the group consisting of titanium silicide, cobalt suicide, nickel silicide and platinum silicide.

7. The structure of claim 1, wherein said polysilicon line is doped N-type or P-type.

8. The structure of claim 1, further including:
    an insulating capping layer on said top surface of said polysilicon line between said first and second sidewalls of said polysilicon line and between said first sidewall of said polysilicon line and said sidewalls of said notch.

9. The structure of claim 8, wherein said insulating capping layer comprises silicon nitride.

* * * * *